United States Patent [19]

Fujii et al.

[11] E Patent Number: Re. 33,400

[45] Reissued Date of Patent: Oct. 23, 1990

[54] CIRCUIT BREAKER

[75] Inventors: Hiroshi Fujii; Hiroaki Fujihisa; Hirotoshi Ohishi; Yoshiaki Kobayashi, all of Fukuyama, Japan

[73] Assignee: Mitsubishi Denki Kabushiki Kaisha, Tokyo, Japan

[21] Appl. No.: 207,133

[22] Filed: Jun. 14, 1988

Related U.S. Patent Documents

Reissue of:

[64] Patent No.: 4,595,895
Issued: Jun. 17, 1986
Appl. No.: 751,252
Filed: Jul. 2, 1985

[51] Int. Cl.[5] ..... H03J 3/00; H03J 1/04; H01H 9/20

[52] U.S. Cl. ..... 335/26; 335/35; 335/27; 335/21; 335/167; 335/168

[58] Field of Search ..... 335/26-27, 335/35, 31, 25, 21, 23, 167-168

[56] References Cited

U.S. PATENT DOCUMENTS 3,970,976 7/1976 Nicol ..... 335/27

FOREIGN PATENT DOCUMENTS 1904731 11/1975 Fed. Rep. of Germany .

*Primary Examiner*—Leo P. Picard
*Assistant Examiner*—Lincoln Donovan
*Attorney, Agent, or Firm*—Lowe, Price, LeBlanc, Becker & Shur

[57] ABSTRACT

A circuit breaker characterized by a roller guide member, 1a, provided on the inside wall of an upper part of the case 1. The roller quite member, 1a, has a curved shape designed to form or smooth curved path, 100, in cooperation with the roller receiving indents 5a and 56, so that the roller can be reliably reset in the roller-receiving indents 5a and 5b.

3 Claims, 7 Drawing Sheets

FIG,2 (Prior Art)

CIRCUIT BREAKER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to a circuit breaker, and particularly concerns to a circuit breaker capable of smooth automatic resetting action.

2. Description of the Prior Art

A typical conventional circuit breaker is shown in FIG. 1 through FIG. 3 which are sectional side views of the circuit breaker. Therein FIG. 1 shows an OFF state, FIG. 2 shows an ON state and FIG. 3 shows a tripping state which is a state immediately after a tripping and before restoration. In these drawings, numeral 1 designates a case made of an insulating plastic resin mold, numeral 2 designates a handle which is cradably fulcrumed by a pin 101. A torsion spring 3 is wound around the pin 101 and one end of the torsion spring 3 is held by a part of the case and the other end thereof is held on a part of the handle 2 thereby to energize the handle 2 in anticlockwise direction. A U-shaped link 4 is rotatably held by its one end in a hole 202 of an internal lever 201 of the handle 2 and a roller 9 is rotatably held on the other end of the U-shaped link 4. A moving contact arm 5 having a moving contact 12 at its lower end is fulcrumed by a pin 6 which is fixed to the case 1 and has a roller-receiving-indent 5a, 5b at its top part. An engaging lever 7 having an engaging part 7a at its upper end and a pushing seat 7b at its upper side part is fulcrumed also by the pin 6, and the engaging lever 7 is energized by a torsion spring 8 in anticlockwise direction. Thereby, the engaging part 7a catches the roller 9 in the states other than an instant immediately after a tripping. A pin 11 fixed on the moving contact arm is pulled by a tension spring 14 which is fixed by its other end to a pin 13 mounted on the case 1. A fixed contact 15 is fixed on a part of the case 1, in a manner to face the moving contact 12 so as to touch the latter when the moving contact arm 5 is rotated anticlockwise by a clockwise rotation of the handle 2 and the leftward motion of the roller 9 due to a toggle motion of a toggle link system consisting of the internal lever 201 and the U-shaped link 4. A solenoid coil 17 being wound around a bobbin 25 and having a plunger 23 therein is connected between a terminal 19 and the fixed contact 15. The terminal 19 is for connecting to outside conductor (not shown) by a wire pressing member 20 and a screw 21. A yoke of the solenoid coil 17 is mounted on the case 1. The plunger 23 has a restoring spring 24 energizing it to the right direction and also has a rod 26 which is for pushing the engaging lever 7 when a very large overcurrent, for instance, a shortcircuit current flows. A bimetal 30 which is connected by a soft conductor 29 to the moving contact 12 is connected and mounted on a fixed contact 31, to which an outer conductor (not shown) is to be connected by a wire pressing member 32 and a screw 33. Numeral 34 designates an adjusting screw for fine adjustment of angle of the bimetal 30. The middle part of the bimetal 30 is covered by an insulation sheath 35. A known arc runner 36 is connected by its one end to the fixed conductor 31 and its other end is mounted on the base part of the case 1.

Numeral 38 designates a known side plate made of inorganic substance and disposed in parallel direction of running of arc on both sides of the arc runner. A known arc extinguish chamber 42 having plural grids 43 disposed with predetermined gaps between a pair of side plates 44 is provided next to the arc runner 36.

The operation of the conventional circuit breaker is as follows. In both states of the OFF state shown in FIG. 1 and the ON state shown in FIG. 2 of the circuit breaker, the roller 9 is held by the engaging part 7a of the engaging lever 7 and the roller-receiving-indent 5a, 5b of the moving contact arm 5, and thereby the U-shaped link 4 is fixed in the positions shown in FIG. 1 and FIG. 2, respectively.

When the handle 2 is rotated from the OFF state of FIG. 1 to ON state of FIG. 2, the toggle link system constituted by the internal lever 201 and the U-shaped link 4 moves upwards passing a dead point to the state of FIG. 2 and the toggle link system is extended thereby.

Accordingly the moving contact arm 5 is rotated anticlockwise around the pin 6, thereby making the moving contact 12 touch the fixed contact 16 as shown in FIG. 2.

On the contrary, when the handle 2 is rotated anticlockwise to the OFF state of FIG. 1, the toggle link system moves downwards to the original bent-shaped relation shown in FIG. 1, thereby rotating the moving contact arm 5 in clockwise direction around the pin 6, and the moving contact 12 is detached from the fixed contact 16 as shown in FIG. 1.

When a relatively moderate overcurrent, for instance, an overload current arises, the bimetal 30 is heated by its Joule heat due to the overcurrent flowing therethrough and is bent towards the moving contact arm 5, and hence the pushing seat 7b is pushed clockwise. Accordingly, by the right hand displacement of the engaging pin 7a, the engagement of the roller 9 in the roller-receiving-indent 5a, 5b is released. Therefore, the moving contact arm 5 is rotated clockwise by the force of the tension spring 14, and the moving contact 12 is detached from the fixed contact 16, and a tripping state as shown in FIG. 3 is produced. Thereafter, by means of the torsion spring 3, the handle 2 is automatically rotated anticlockwise, and then the toggle link system restores to the state of FIG. 1 by falling of the roller 9 in a gap formed between the roller-receiving-indent 5a, 5b and the engaging part 7a. Thus, the state of the circuit breaker is restored to the OFF state shown in FIG. 1. In such moderate overcurrent case, the tripping and restoration of the circuit breaker proceed in an appropriate time delays induced by slow bending and restoring of the bimetal 30.

On the other hand, when a large overcurrent, for instance, by a shortcircuit current arises, the coil 17 is excited by the large current and the plunger 23 is driven leftwards in a high speed motion overcoming the force of the restoring spring 24, and hence the rod 26 strongly pushes the engaging lever 7 leftwards thereby driving it clockwise. As a result, the engaging part 7a releases the holding of the roller 9 and therefore the toggle link system constituted by the internal level 201 and the U-shaped link 4 is released from the roller-receiving-indent 5a, 5b of the moving contact arm 5. And thereby, the moving contact arm 5 is rotated clockwise by means of the tension spring 14. Accordingly the moving contact 12 detaches from the fixed contact 16, thereby making a disconnection, and a tripping state as shown in FIG. 3 is produced. Thereafter, by meahs of the torsion spring 3, the handle 2 is automatically rotated anticlockwise, and then the toggle link system restores to the state of FIG. 1 by falling of the roller 9 in a gap formed between the roller-receiving-indent 5a, 5b and the engaging part 7a. Thus, the state of the circuit breaker is restored to the OFF state shown in FIG. 1. This large overcurrent tripping proceeds in a high speed motion.

The problem of the above-mentioned conventional circuit breaker is that, in a resetting action which after the tripping, since the motion of the roller 9 is rather free around the engaging part 7a, sometimes the roller 9 undesirably rides over wrong side of the engaging part 7a and caught by the engaging part 7a at the wrong side. Therefore, reliability of automatic resetting of the toggle link system is not sufficiently high.

SUMMARY OF THE INVENTION

The purpose of the present invention is to provide an improved circuit breaker wherein the aforementioned problem of the conventional circuit breaker is dissolved such that reliable automatic resetting of the toggle link system is always assured, by providing a roller g uide member which is for guiding the roller rightly into a resetting position thereby to assure automatic smooth resetting.

The circuit breaker in accordance with the present invention comprises:

a handle for connection and disconnection of contacts by outside controlling thereof and energized by a spring toward its position of disconnection, a link member which is linked by its one end to a driving part of the handle, thereby to form a toggle link system together with the handle, a roller rotatably held on the other end of the link member, a fixed contact fixed on a part of a case, a moving contact arm which has a roller-receiving-indent on one end part and a moving contact on the other end part, is cradlably fulcrumed on the case and is energized in a direction to make the moving contact [touch] *detach from* the fixed contact to make the [connection] *disconnection,* an engaging lever which has an engaging part disposed to face the roller-receiving-indent to hold the roller and is cradlably fulcrumed on the case, an overcurrent trip device which is for releasing the engaging of the roller by the engaging part when an overcurrent above a predetermined value arises, thereby making the moving contact detach from the fixed contact to make the disconnection, and a roller guide member which is formed in the case to form a roller guiding path together with the roller-receiving-indent for smooth guiding of the roller during its motion from a tripped position where the roller is apart from the roller-receiving-indent to a reset position where the roller is resting on the roller-receiving-indent.

DESCRIPTION OF THE PREFERRED EMBODIMENT

Figure 4:
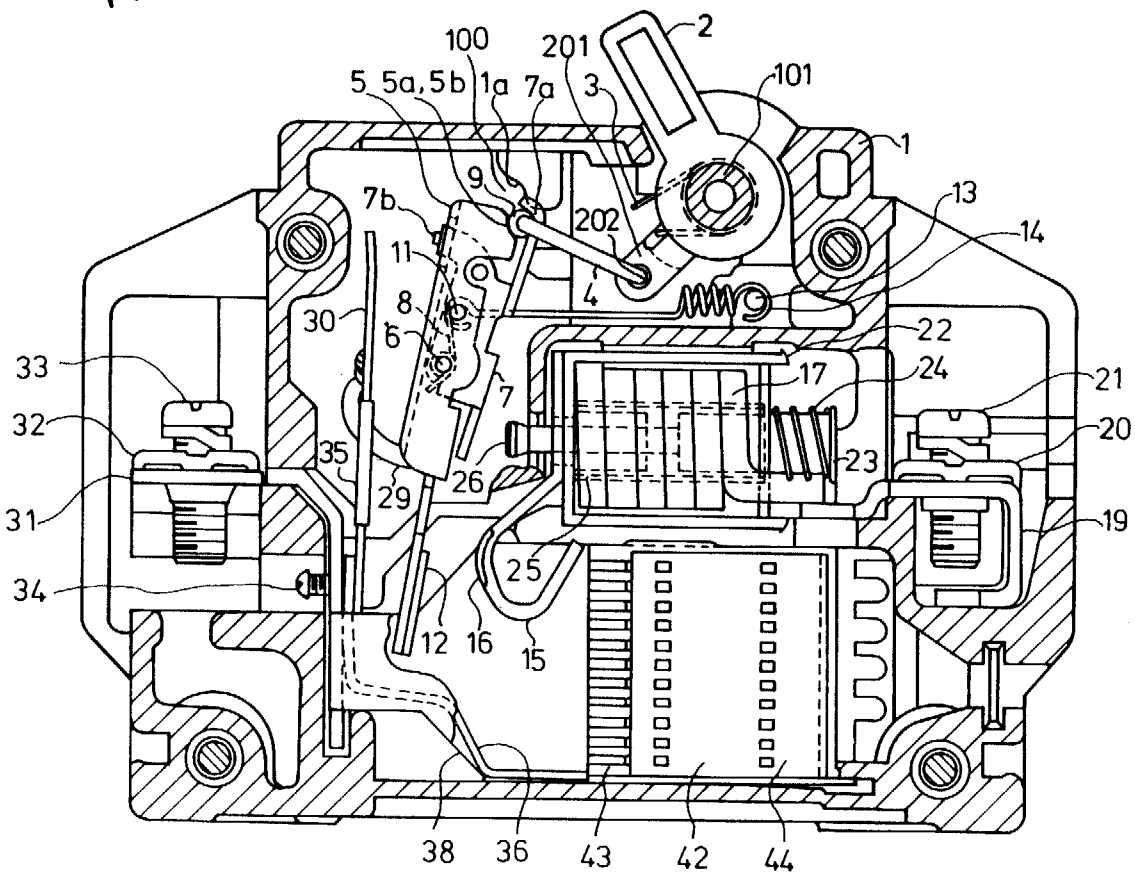
FIG. 4 is a sectional side view of a circuit breaker of a preferred embodiment of the present invention in an OFF state.
Figure 5:
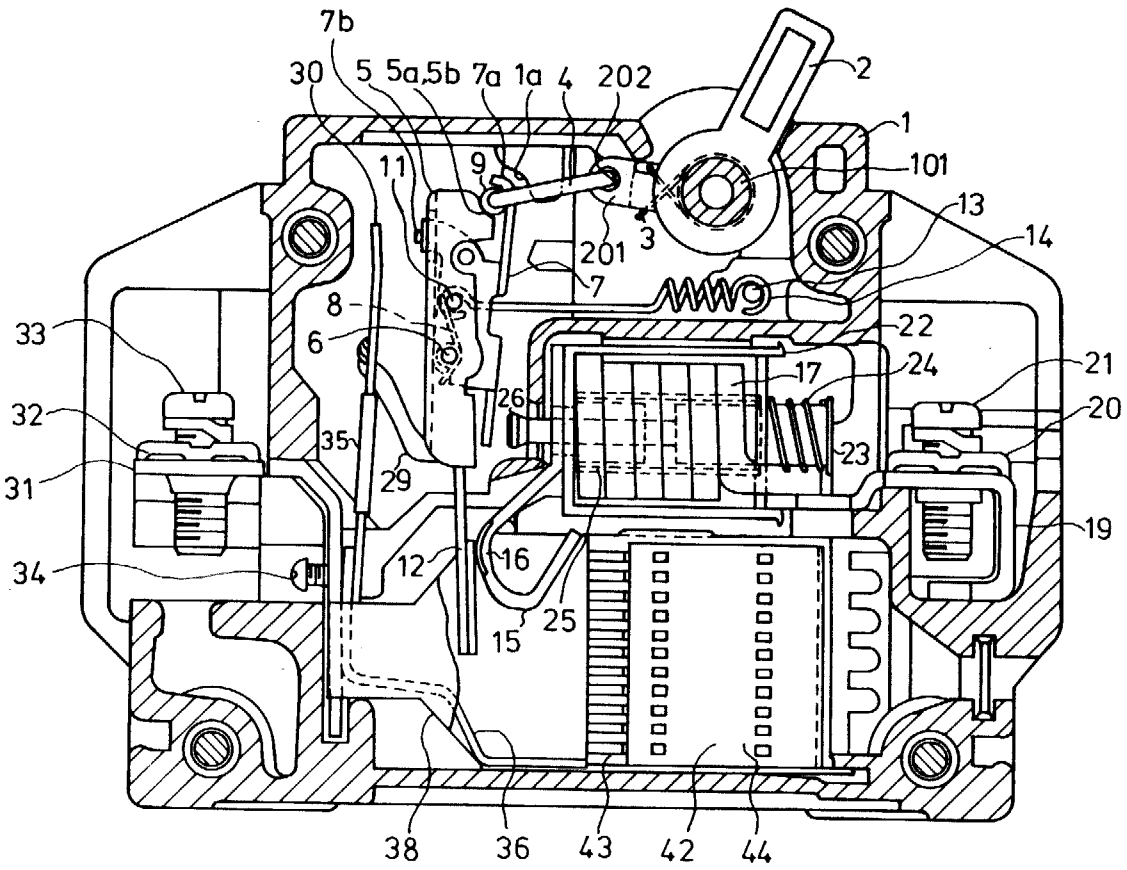
FIG. 5 is a sectional side view of the circuit breaker of the embodiment in an ON state.
Figure 6:
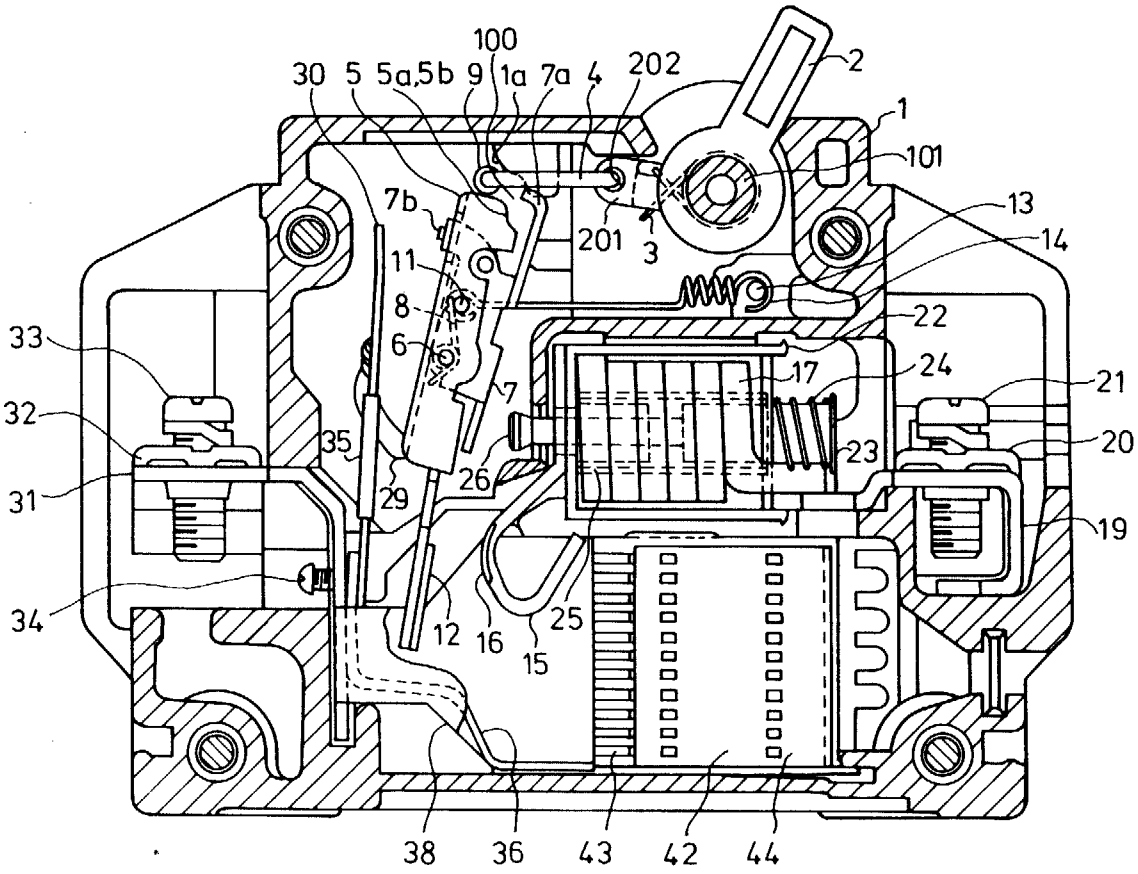
FIG. 6 is a sectional side view of the circuit breaker of the embodiment in an tripping state.
Figure 7:
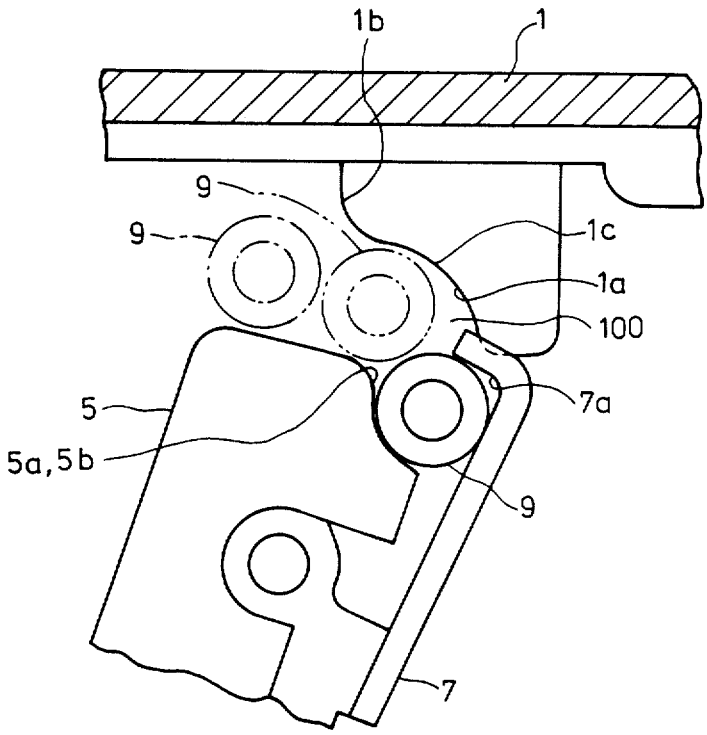
FIG. 7 is an enlarged view of a roller and relevant parts showing motions of a roller 9 of the embodiment.

A preferred embodiment in accordance with the present invention is described in detail with reference to FIG. 4 through FIG. 6 and FIG. 7 which are sectional side views of the circuit breaker and a schematic view showing the motion of a roller 9, respectively. Therein FIG. 4 shows an OFF state, FIG. 5 shows an ON state, FIG. 6 shows a tripping state which is a state immediately after a tripping and before restoration, and FIG. 7 shows a partially enlarged view showing motions of a roller 9 of the embodiment. In these drawings, numeral 1 designates a case made of an insulating plastic resin mold, which has a handle 2 which is cradlably fulcrumed to a part of the case 1 by a pin 101. A torsion spring 3 is wound around the pin 101 and one end of the torsion spring 3 is held by a part of the case and the other end thereof is held on a part of the handle 2 thereby eo energize the handle 2 in anticlockwise direction. A U-shaped link 4 is rotatably held by its one end in a hole 202 of an internal lever 201 of the handle 2 and a roller 9 is rotatably held on the other end of the U-shaped link 4. A moving contact arm 5 having a moving contact 12 at its lower end is fulcrumed by a pin 6 which is fixed to the case 1 and has a roller-receiving-indent 5a, 5b at its top part. An engaging lever 7 having an engaging parts 7a at its upper end and a pushing seat 7b at its upper side part is fulcrimed also by the pin 6, and the engaging lever 7 is energized by a torsion spring 8 in anticlockwise direction. Thereby, the engaging part 7a catches the roller 9 in the states other than an instant immediately after a tripping.

The feature in configuration of the present invention is providing of a roller guide member 1a in an integral mold configuration to an inside wall of an upper part of the case 1. The roller guiding member 1a has a curved shape which is designed to form a smooth curved path 100 together with the roller-receiving-indent 5a, 5b at the upper end part of the moving contact arm 5. The smooth curved path 100 formed between the roller guide member 1a and the roller-receiving-indent 5a, 5b of the upper part of the moving contact arm 5 is designed so that the roller 9 can automatically restore from the tripped position shown in FIG. 6 to the OFF state position shown in FIG. 1. In order to assure the automatic restoration, the roller guiding member has a tapered convex curve part 1b at an entrance part of said roller guiding path 100 and a concave downward curve part 1c connected to the tapered convex curve part 1b. A pin 11 fixed on the moving contact arm is pulled by a tension spring 14 which is fixed by its other end to a pin 13 mounted on the case 1. A fixed contact 15 is fixed on a part of the case 1, in a manner to face the moving contact 12 so as to touch the latter when the moving contact arm 5 is rotated anticlockwise by a clockwise rotation of the handle 2 and the leftward motion of the roller 9 due to a toggle motion of a toggle link system consisting of the internal lever 201 and the U-shaped link 4. A solenoid coil 17 being wound around a bobbin 25 and having a plunger 23 therein is connected between a terminal 19 and the fixed contact 15. The terminal 19 is for connecting to outside conductor (not shown) by a wire pressing member 20 and a screw 21. A yoke of the solenoid coil 17 is mounted on the case 1. The plunger 23 has a restoring spring 24 energizing it to the right direction and also has a rod 26 which is for pushing the engaging lever 7 when a very large overcurrent, for instance, a shortcircuit current flows. A bimetal 30 which is connected by a soft conductor 29 to the moving contact 12 is connected and mounted on a fixed contact 31, to which an outer conductor (not shown) is to be connected by a wire pressing member 32 and a screw 33. Numeral 34 designates an adjusting screw for fine adjustment of angle of the bimetal 30. The middle part of the bimetal 30 is covered by an insulation sheath 35. A known arc runner 36 is connected by its one end to the fixed conductor 31 and its other end is mounted on the base part of the case 1. Numeral 38 designates a known side plate made of inorganic substance and disposed in parallel direction of running of arc on both sides of the arc runner. A known arc extinguish chamber 42 having plural grids 43 disposed with predetermined gaps between a pair of side plates 44 is provided next to the arc runner 36.

The operation of the above-mentioned embodiment of the circuit breaker is as follows. In both states of the OFF-state shown in FIG. 4 and the ON state shown in FIG. 5 of the circuit breaker, the roller 9 is held by the engaging part 7a of the engaging lever 7 and the roller-receiving-indent 5a, 5b of the moving contact arm 5, and thereby the U-shaped link 4 is fixed in the positions shown in FIG. 4 and FIG. 5, respectively.

Figure 1:
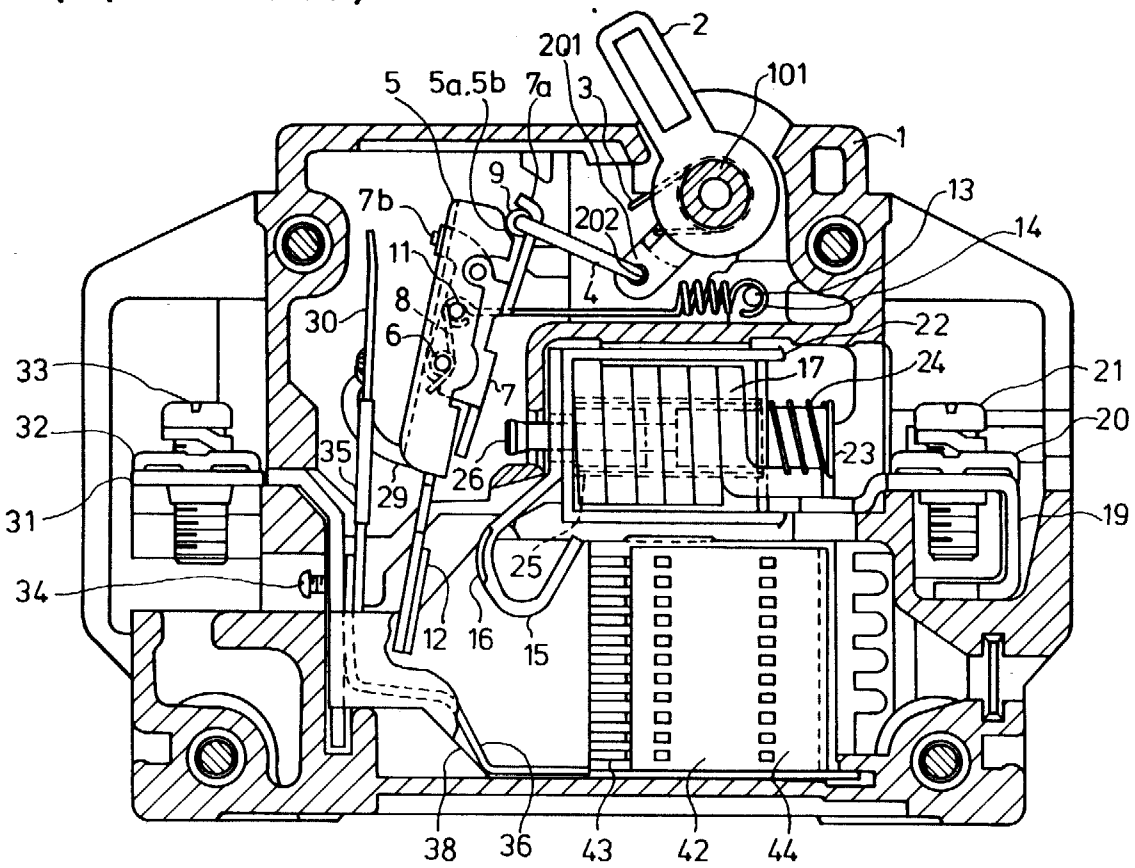
FIG.1 (Prior Art)
FIG. 1 is the sectional side view of the typical conventional circuit breaker in the OFF state.
Figure 2:
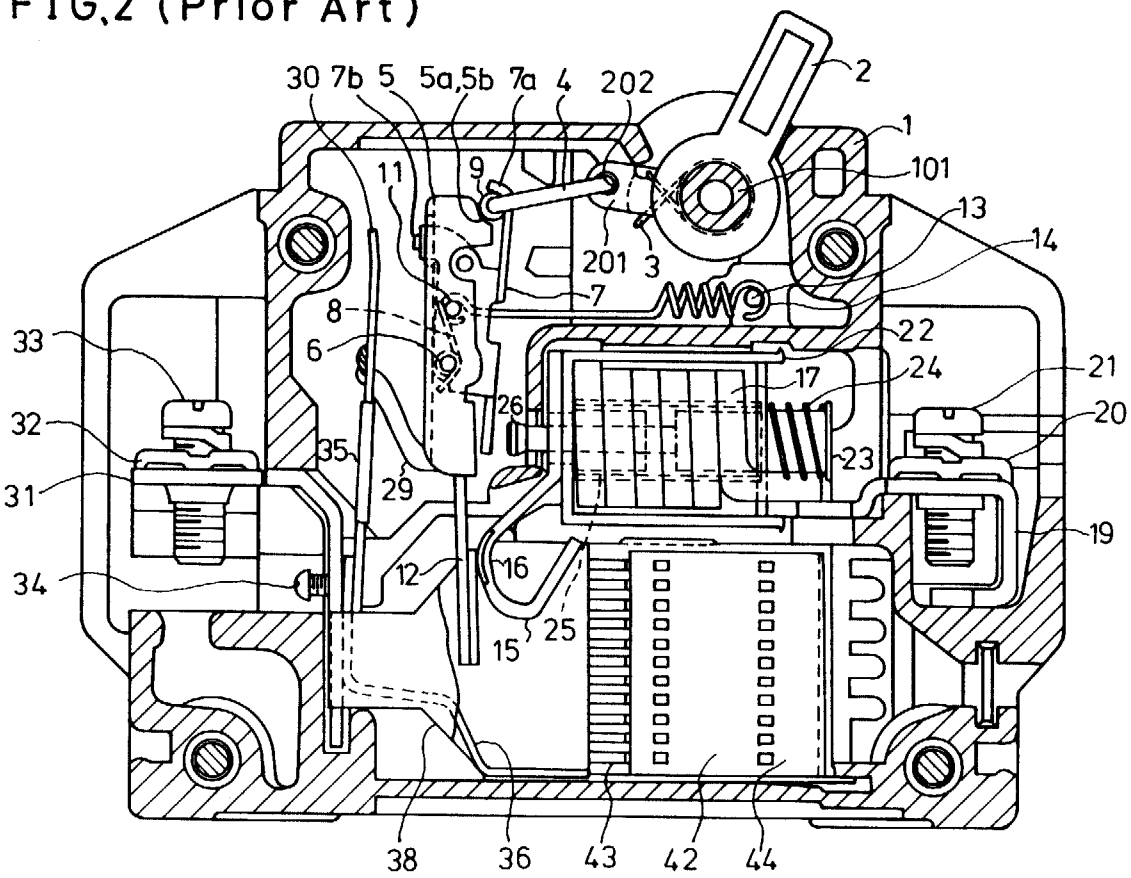
FIG. 2 is the sectional side view of the conventional circuit breaker in the ON state.
Figure 3:
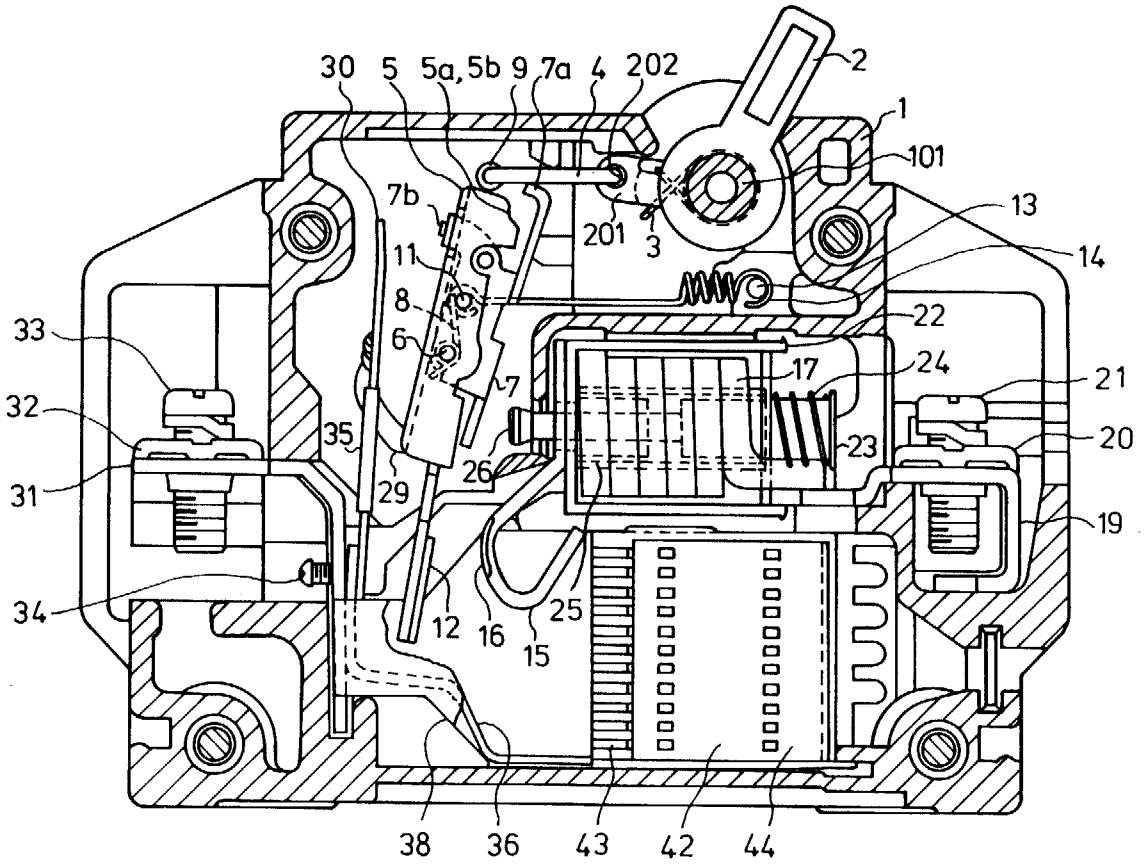
FIG.3 (Prior Art)
FIG. 3 is the sectional side view of the conventional circuit breaker in the tripping state.

When the handle 2 is rotated from the OFF state of FIG. 1 to ON state of FIG. 5, the toggle link system constituted by the internal lever 201 and the U-shaped link 4 moves upwards passing a dead point to the state of FIG. 5 and the toggle link system is extended thereby. Accordingly the moving contact arm 5 is rotated anticlockwise around the pin 6, thereby making the moving contact 12 touch the fixed contact 16 as shown in FIG. 5.

On the contrary, when the handle 2 is rotated anticlockwise to the OFF state of FIG. 4, the toggle link system moves downwards to the original bent-shaped relation shown in FIG. 4, thereby rotating the moving contact arm 5 in clockwise direction around the pin 6, and the moving contact 12 is detached from the fixed contact 16 as shown in FIG. 4.

When a relatively moderate overcurrent, for instance, an overload current arises, the bimetal 30 is heated by its Joule heat due to the overcurrent flowing therethrough and is bent towards the moving contact arm 5, and hence the pushing seat 7b is pushed clockwise. Accordingly, by the right hand displacement of the engaging part 7a, the engagement of the roller 9 in the roller receiving indent 5a, 5b is released. Therefore, the moving contact arm 5 is rotated clockwise by the force of the [torsion] *tension* spring 14, and the moving contact 12 is detached from the fixed contact 16, and a tripping state as shown in FIG. 6 is produced. Thereafter, by means of the torsion spring 3, the handle 2 is automatically rotated anticlockwise, and then the toggle link system restores to the state of FIG. 4. In this process, roller 9 moves as shown from one dot chain line position in the left, through two dots chain line position in the midway position to the solid line position in the right of FIG. 7, and the guide member 1a certainly and smoothly guides the restoration movement of the roller 9 through the smooth path 100 to the roller receiving indent 5a, 5b as shown in FIG. 7. Therefore, the restoration of the roller 9 to the original state shown in FIG. 4 and hence the resetting of the roller 9 and the toggle link system is always assured. Thus, the state of the circuit breaker is resetted to the OFF state shown in FIG. 4. In such moderate overcurrent case, the tripping and restoration of the circuit breaker proceed in an appropriate time delays induced by slow bending and restoring of the bimetal 30.

On the other hand, when a large overcurrent, for instance, by a shortcircuit current arises, the coil 17 is excited by the large current and the plunger 23 is driven leftwards in a high speed motion overcoming the force of the restoring spring 24, and hence the rod 26 strongly pushes the engaging lever 7 leftwards thereby driving it clockwise. As a result, the engaging part 7a releases the holding of the roller 9 and therefore the toggle link system constituted by the internal lever 201 and the U-shaped link 4 is released from the roller receiving indent 5a, 5b of the moving contact arm 5. And thereby, the moving contact arm 5 is rotated clockwise by means of the tension spring 14. Accordingly the moving contact 12 detaches from the fixed contact 16, thereby making a disconnection, and a tripping state as shown in FIG. 6 is produced. Thereafter, by means of the torsion spring 3, the handle 2 is automatically rotated anticlockwise, and then the toggle link system restores to the state of FIG. 4. Also in this process, roller 9 moves as shown from one dot chain line position in the left, through two dots chain line position in the midway position to the solid line position in the right of FIG. 7, and the guide member 1a certainly and smootly guides the restoration movement of the roller 9 through the smooth path 100 to the roller receiving indent 5a, 5b as shown in FIG. 7. Therefore the restoration of the roller 9 to the original state shown in FIG. 4 and hence the resetting of the roller and the toggle link system is always assured. Thus, the state of the circuit breaker is resetted to the OFF state shown in FIG. 4. This large overcurrent tripping proceeds in a high speed motion.

As a result of the provision of the roller guiding member 1a , the certain and reliable automatic resetting of the roller 9 and the toggle link system after every trippings of the circuit breaker both in moderate overcurrent operation and in a large overcurrent operation is assured.

What is claimed is:

1. A circuit breaker comprising:

a handle for connection and disconnection of contacts by outside controlling thereof and energized by a spring toward its position of disconnection, a link member which is linked by its one end to a driving part of said handle, thereby to form a toggle link system together with said handle, a roller rotatably held on the other end of said link member, a fixed contact fixed on a part of a case, a moving contact arm which has a roller receiving indent on one end part and a moving contact on the other end part, is cradlably fulcrumed on the case and is energized in a direction to make said moving contact [touch] *detach from* said fixed contact to make said [connection] *disconnection,* an engaging lever which has an engaging part disposed to face said roller receiving indent to hold said roller and its cradlably fulcrumed on the case, an overcurrent trip device which is for releasing said engaging of said roller by said engaging part when an overcurrent above a predetermined value arises, thereby making said moving contact detach from said fixed contact to make said disconnection, and a roller guide member which is provided in said case to form a roller guiding path together with said roller-receiving-indent for smooth guiding of said roller during its motion from a tripped position where said roller is apart from said roller-receiving-indent to a reset position where said roller is resting on said roller-receiving-indent.

2. A circuit breaker in accordance with claim 1, wherein said roller guide member is formed in an integral mold configuration to an inside wall of an upper part of said case.

3. A circuit breaker in accordance with claim 2, wherein said roller guiding member has a tapered convex curve part at an entrance part of said roller guiding path and a concave downward curve part connected to the tapered convex curve part.

* * * * *